US009658266B2

(12) United States Patent
Petereit et al.

(10) Patent No.: US 9,658,266 B2
(45) Date of Patent: May 23, 2017

(54) CAPACITIVE DETECTION DEVICE

(71) Applicant: IEE INTERNATIONAL ELECTRONICS & ENGINEERING S.A., Echternach (LU)

(72) Inventors: Andreas Petereit, Schweich (DE); Alexander Treis, Kasel (DE)

(73) Assignee: IEE International Electronics & Engineering S.A., Echternach (LU)

( * ) Notice: Subject to any disclaimer, the term of this patent is extended or adjusted under 35 U.S.C. 154(b) by 109 days.

(21) Appl. No.: 14/376,473

(22) PCT Filed: Feb. 8, 2013

(86) PCT No.: PCT/EP2013/052585
§ 371 (c)(1),
(2) Date: Aug. 4, 2014

(87) PCT Pub. No.: WO2013/117719
PCT Pub. Date: Aug. 15, 2013

(65) Prior Publication Data
US 2015/0048845 A1    Feb. 19, 2015

(30) Foreign Application Priority Data
Feb. 10, 2012    (LU) ........................................ 91 942

(51) Int. Cl.
*B60R 21/015*    (2006.01)
*G01R 27/26*    (2006.01)
(Continued)

(52) U.S. Cl.
CPC ......... *G01R 27/2605* (2013.01); *B60N 2/002* (2013.01); *B60R 21/01532* (2014.10);
(Continued)

(58) Field of Classification Search
CPC ........ B60R 21/01532; B60R 21/01516; B60R 21/01512; B60R 21/01542; B60N 2/002;
(Continued)

(56) References Cited

U.S. PATENT DOCUMENTS 6,158,768 A * 12/2000 Steffens, Jr. ...... B60R 21/01532
180/237
6,161,070 A    12/2000 Jinno et al.
(Continued)

FOREIGN PATENT DOCUMENTS

CN    101246192 A    8/2008
CN    101472770 A    7/2009
(Continued)

OTHER PUBLICATIONS

International Search Report for corresponding application PCT/EP2013/052585 filed Feb. 8, 2013; Mail date Apr. 3, 2013.
(Continued)

Primary Examiner — Son Le
Assistant Examiner — Alesa Allgood
(74) Attorney, Agent, or Firm — Reising Ethington P.C.

(57) ABSTRACT

A capacitive detection device (20) for a vehicle comprises a sensing electrode (26) for generating an oscillatory electric field in a detection space and a shielding electrode (28) arranged on a side of the sensing electrode turned away from the detection space. The capacitive detection device comprises a circuit ground and a ground connector for connecting the circuit ground to chassis ground of the vehicle. At least one shunt capacitor is connected between circuit ground and the shielding electrode. The at least one shunt capacitor has a capacitance at least 25 times higher than the capacitance between the shielding electrode and the chassis ground of the vehicle.

13 Claims, 2 Drawing Sheets

(51) Int. Cl.
*H03K 17/955* (2006.01)
*H03K 17/96* (2006.01)
*G01R 1/18* (2006.01)
*B62D 1/04* (2006.01)
*B60N 2/00* (2006.01)

(52) U.S. Cl.
CPC .............. *B62D 1/046* (2013.01); *G01R 1/18* (2013.01); *H03K 17/955* (2013.01); *H03K 17/962* (2013.01); *H03K 2217/94094* (2013.01); *H03K 2217/960705* (2013.01); *H03K 2217/960765* (2013.01)

(58) Field of Classification Search
CPC ........ B60N 2/2863; B60N 2/28; B60N 2/286; B60N 2002/0268; B60N 2002/0272; H03K 17/955; G01R 27/2605; G01V 3/088
See application file for complete search history.

(56) References Cited

U.S. PATENT DOCUMENTS

| | | | | |
|---|---|---|---|---|
| 6,392,542 | B1* | 5/2002 | Stanley | B60N 2/002 280/735 |
| 7,005,864 | B2* | 2/2006 | Iannello | G01D 3/02 324/632 |
| 7,503,776 | B1 | 3/2009 | Pavlovic et al. | |
| 7,649,278 | B2* | 1/2010 | Yoshida | B60K 37/06 307/9.1 |
| 8,432,322 | B2 | 4/2013 | Amm et al. | |
| 9,006,618 | B2* | 4/2015 | Lamesch | B60N 2/002 219/202 |
| 9,061,641 | B2* | 6/2015 | Lamesch | B60N 2/002 |
| 2003/0009273 | A1 | 1/2003 | Stanley et al. | |
| 2005/0242965 | A1 | 11/2005 | Rieth et al. | |
| 2007/0062753 | A1* | 3/2007 | Yoshida | B60K 37/06 180/333 |
| 2007/0132559 | A1* | 6/2007 | Schleeh | B60R 21/01532 340/425.5 |
| 2009/0194406 | A1 | 8/2009 | Scheckenbach | |
| 2010/0280717 | A1* | 11/2010 | Schoos | B60R 21/01532 701/45 |
| 2011/0001549 | A1* | 1/2011 | Van Gastel | H03K 17/955 327/517 |
| 2011/0115500 | A1* | 5/2011 | Stanley | B60N 2/002 324/661 |
| 2012/0007567 | A1* | 1/2012 | Disney | H02M 1/44 320/166 |

FOREIGN PATENT DOCUMENTS

| | | | | |
|---|---|---|---|---|
| CN | 101521318 | A | 9/2009 | |
| CN | 201508416 | U | 6/2010 | |
| CN | 101858941 | A | 10/2010 | |
| CN | 101958455 | A | 1/2011 | |
| EP | 0564164 | * | 10/1993 | .............. G01D 5/24 |
| EP | 0564164 | A1 | 10/1993 | |
| EP | 1870292 | A1 | 12/2007 | |
| EP | 2110834 | A1 | 10/2009 | |

OTHER PUBLICATIONS

J. R. Smith, "Electric Field Sensing for Graphical Interfaces", Computer Graphics I/O Devices, Issue May/Jun. 1998, vol. 18, No. 3, pp. 54-60, XP000927340.

Written Opinion for corresponding application PCT/EP2013/052585 filed Feb. 8, 2013; Mail date Apr. 3, 2013.

English machine translation of Hu Weidong, "Analysis of Bypass capacitance in High Speed PCB", http://www.epc.com.cn/subject/200407/3790.html, dated Jul. 1, 2004, 7 pages.

"Rational Selection and Use of Bypass Capacitance", mengdongzhe, http://blog.I63.com/dsp_1nint/blog/static/03167434200810273323789/, dated Nov. 27, 2008, 2 pages. See English translation of Chinese office action for English language summary of the relevance of this reference.

"EMC/EMI Control Technology in PCB Design", chunyang, http://www.dzsccom/data/html1/2011-8-31/9132_2.html, dated Aug. 31, 2011, 2 pages, See English translation of Chinese office action for English language summary of the relevance of this reference.

Chinese Office Actions in Chinese with English translation for CN application No. 2013800088710, dated Jul. 20, 2016, 24 pages.

* cited by examiner

CAPACITIVE DETECTION DEVICE

TECHNICAL FIELD

The present invention generally relates to a capacitive detection device, e.g. for detecting the absence or presence of an occupant on a vehicle seat or for detecting whether a vehicle driver has their hands on the steering wheel.

BACKGROUND OF THE INVENTION

A capacitive sensor, called by some electric field sensor or proximity sensor, designates a sensor, which generates a signal responsive to the influence of what is being sensed (a person, a part of a person's body, a pet, an object, etc.) upon an electric field. A capacitive sensor generally comprises at least one antenna electrode, to which is applied an alternating electric signal and which thereupon emits an electric field into a region of space proximate to the antenna electrode, while the sensor is operating. The sensor comprises at least one sensing electrode at which the influence of an object or living being on the electric field is detected. In some (so-called "loading mode") capacitive occupancy sensors, the one or more antenna electrodes serve at the same time as sensing electrodes. In this case, the measurement circuit determines the current flowing into the one or more antenna electrodes in response to an oscillating voltage being applied to them. The relationship of voltage to current yields the complex impedance of the one or more antenna electrodes. In an alternative version of capacitive sensors ("coupling mode" capacitive sensors), the transmitting antenna electrode(s) and the sensing electrode(s) are separate from one another. In this case, the measurement circuit determines the current or voltage that is induced in the sensing electrode when the transmitting antenna electrode is operating.

The different capacitive sensing mechanisms are explained in the technical paper entitled "Electric Field Sensing for Graphical Interfaces" by J. R. Smith, published in Computer Graphics I/O Devices, Issue May/June 1998, pp 54-60. The paper describes the concept of electric field sensing as used for making non-contact three-dimensional position measurements, and more particularly for sensing the position of a human hand for purposes of providing three dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an alternating voltage signal is applied to a transmit electrode, which builds up an alternating electric field to ground. The object to be sensed modifies the capacitance between the transmit electrode and ground. In the "shunt mode", an alternating voltage signal is applied to the transmit electrode, building up an electric field to a receive electrode, and the displacement current induced at the receive electrode is measured, whereby the displacement current may be modified by the body being sensed. In the "transmit mode", the transmit electrode is put in contact with the user's body, which then becomes a transmitter relative to a receiver, either by direct electrical connection or via capacitive coupling. "Shunt mode" is alternatively referred to as the above-mentioned "coupling mode".

Capacitive occupant sensing systems have been proposed in great variety, e.g. for controlling the deployment of one or more airbags, such as e.g. a driver airbag, a passenger airbag and/or a side airbag. U.S. Pat. No. 6,161,070, to Jinno et al., relates to a passenger detection system including a single antenna electrode mounted on a surface of a passenger seat in an automobile. An oscillator applies on alternating voltage signal to the antenna electrode, whereby a minute electric field is produced around the antenna electrode. Jinno proposes detecting the presence or absence of a passenger in the seat based on the amplitude and the phase of the current flowing to the antenna electrode. U.S. Pat. No. 6,392,542, to Stanley, teaches an electric field sensor comprising an electrode mountable within a seat and operatively coupled to a sensing circuit, which applies to the electrode an alternating or pulsed signal "at most weakly responsive" to wetness of the seat. Stanley proposes to measure phase and amplitude of the current flowing to the electrode to detect an occupied or an empty seat and to compensate for seat wetness.

US 2005/0242965 discloses a steering wheel for a motor vehicle comprising a capacitive detection device for hands-on detection. The term "hands-on detection" is in the following used to designate the detection of a contact between the steering wheel and at least one of the driver's hands. "Hands-off detection" or "free hand recognition" designates detection of the absence of a contact between the steering wheel and at least one of the driver's hands. Hands-on and hands-off detectors may use the same technology.

Capacitive detection devices have to be robust against a certain level of electromagnetic interference (EMI). Notably the automotive manufacturers prescribe that capacitive detection devices arranged in cars work properly even in electromagnetically noisy conditions. With the ever increasing use of electronic equipment in cars, the importance of electromagnetic compatibility becomes a more and more important issue.

BRIEF SUMMARY

The invention improves the robustness against EMI of a capacitive detection device having a sensing electrode and a so-called driven shielding electrode.

A capacitive detection device according to an aspect of the invention comprises a sensing electrode for generating an oscillatory electric field in a detection space proximate the sensing electrode and a shielding electrode arranged on a side of the sensing electrode turned away from the detection space. The capacitive detection device comprises a circuit ground and a ground connector for connecting the circuit ground to vehicle chassis ground (i.e. the potential of the vehicle body). At least one shunt capacitor is connected between the circuit ground and the shielding electrode. The at least one shunt capacitor has a capacitance at least 25 times higher than the capacitance between the shielding electrode and the chassis ground (without the shunt capacitor). The capacitive detection device preferably comprises measurement circuitry arranged on a printed circuit board (PCB). The circuit ground corresponds to device ground, i.e. a ground connector of the PCB.

As those skilled in the art will appreciate, the shunt capacitor offers a low-impedance path between circuit ground and chassis ground to noise of the BCI (bulk current injection) type with frequencies above 1 MHz. The higher the frequency of the noise, the better it will be deviated into the node at the reference potential (i.e. typically ground) without disturbing the measurement.

Preferably, an AC voltage source is connected between circuit ground and the shielding electrode. The AC voltage source may be configured to apply an oscillatory voltage at a measurement frequency comprised in the range from 50 kHz to 500 kHz into the shielding electrode. A current meter is preferably connected between the sensing electrode and the shielding electrode. According to a preferred embodiment of the invention, the current meter is configured so as to copy the oscillatory voltage in terms of amplitude and phase into the sensing electrode and to output a current measurement signal indicative of a complex current across the current meter necessary for achieving the copying of the oscillatory voltage. The current measurement signal is indicative of capacitive coupling between the sensing electrode and reference potential. The capacitive coupling depends on whether the detection space is occupied an occupant or part of the occupant, e.g. at least one of their hands. Accordingly, the current measurement signal also indicates the presence or absence of at least part of an occupant's body within the detection space.

Preferably, the at least one shunt capacitor is a capacitor having a capacitance in the range from 20 to 100 nF. Most preferably, the at least one shunt capacitor comprises a first capacitor having a capacitance in the range from 20 to 100 nF and a second capacitor, in parallel to the first capacitor, having a capacitance in the range from 50 to 200 pF. Assuming ideal capacitors, the parallel connection of a first and a second capacitor is equivalent to one capacitor with a capacitance that corresponds to the sum of the capacitances of the first and second capacitors. Actual (i.e. non-ideal) capacitors, however, are differently well suited for different frequency ranges. Accordingly, the parallel connection of plural capacitors having different capacitances may be beneficial for noise suppression in different frequency bands.

According to a preferred embodiment of the invention, the capacitive detection device comprises a shielded cable (e.g. a coaxial cable) having a core and a shield, the core connecting the sensing electrode to the current meter the shield connecting the shielding electrode to the AC voltage source.

Other preferred aspects of the invention relate to a hands-on detector for a steering wheel, comprising a capacitive detection device as described hereinabove, and a steering wheel, comprising such a hands-on detector. The hands-on detector may be part of an active cruise control system, e.g. with stop-and-go functionality.

Yet another preferred aspect of the invention relates to an occupant detector for a car seat, comprising a capacitive detection device as described hereinabove. Such an occupant detector may be part of a car seat.

BRIEF DESCRIPTION OF THE DRAWINGS

Further details and advantages of the present invention will be apparent from the following detailed description a not limiting embodiment with reference to the attached drawings, wherein.

DETAILED DESCRIPTION

Figure 1:
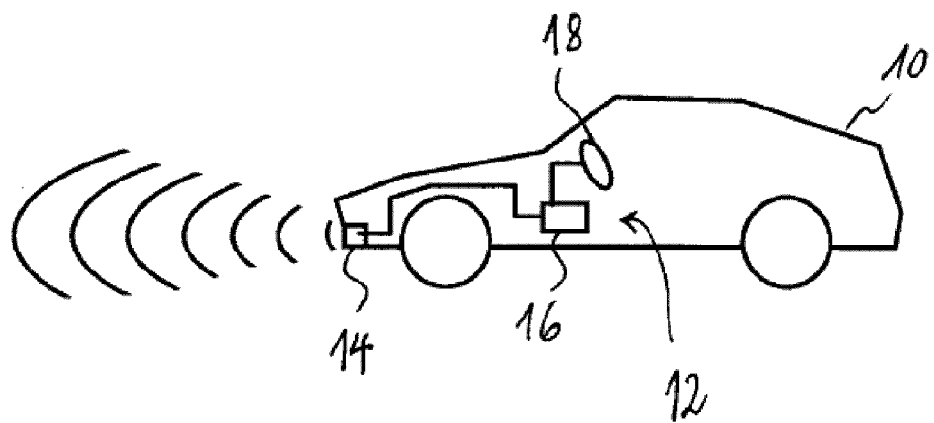
FIG. 1 is a schematic illustration of a car equipped with an ACC system with stop-and-go functionality.

FIG. 1 is a schematic illustration of a car 10 equipped with an active cruise control (ACC) system 12 with stop-and-go functionality. The ACC system 12 comprises one or more distance sensors 14 (e.g. using radar, laser and/or camera equipment for measuring distance) arranged on the front of the car 10 for detecting other cars on the road ahead and measuring the distance to them. An electronic control unit 16 (e.g. an application-specific integrated circuit, a microprocessor or the like) continuously evaluates the radar signals when the ACC system is switched on. When the electronic control unit 16 determines that the car 10 approaches another car ahead, it interacts with the engine ECU and the braking system of the car in order to adapt the car speed and, possibly, to induce an emergency braking. In order to make sure that the driver has their hands on the steering wheel 18 and is able to control the vehicle, the ACC system comprises a capacitive detection device arranged in the steering wheel. Unless the driver holds the steering wheel with at least one of their hands, the ACC system does not take any automatic driving action. It may furthermore output an acoustic, visual and/or haptic warning to the driver.

Figure 2:
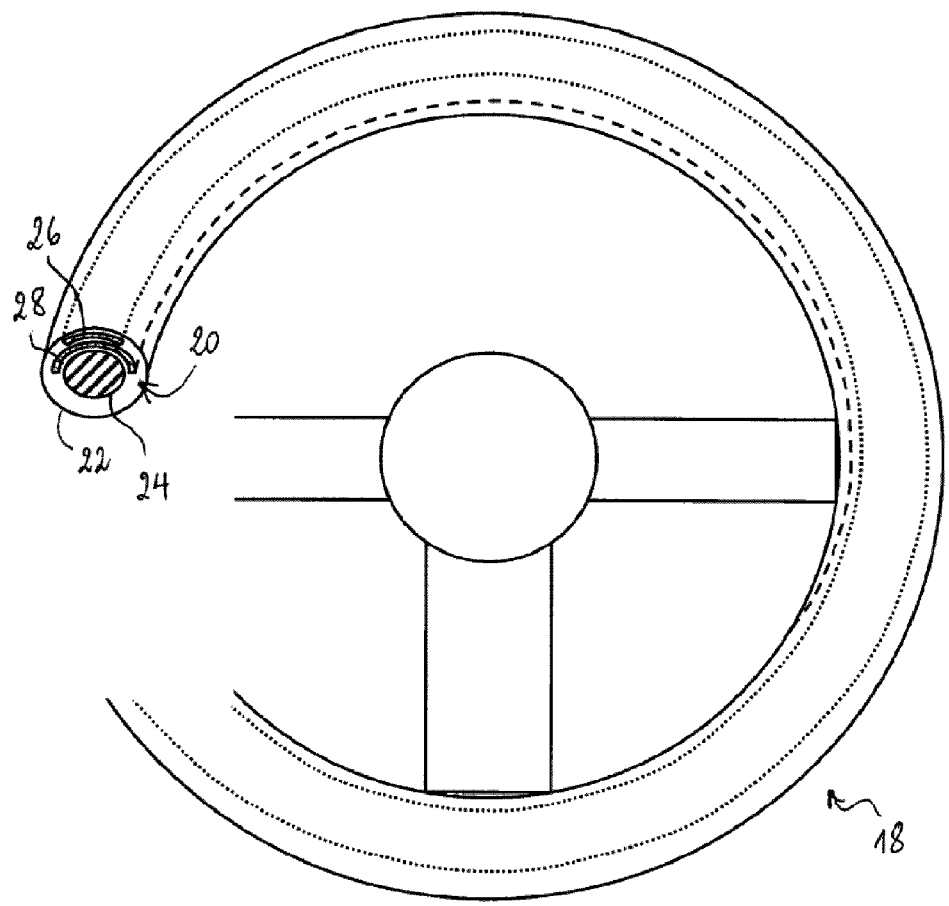
FIG. 2 is a partially sectional view of the steering wheel of the car of FIG. 1.

FIG. 2 is a schematic, partially sectional view of a steering wheel comprising a capacitive detection device 20 in accordance with a preferred embodiment of the invention. The capacitive detection device 20 is integrated in the steering wheel 18 between the leather trim 22 and the metal steering wheel frame 24. In some cases, a wheel heating system is integrated, too. In such a case, the capacitive detection device is arranged above the heater (i.e. between the heater and the leather trim).

The capacitive detection device 20 comprises a sensing electrode 26 and a shielding electrode 28 and is configured to measure the capacitance between the sensing electrode 26 and the car chassis. The sensing electrode 26 and the shielding electrode extend along the entire circumference of the steering wheel 18. The capacitive detection device 20 keeps the sensing electrode 26 and the shielding electrode 28 at the same AC potential, in terms of amplitude and phase. It follows that at any point in time, the electric field between the sensing electrode 26 and the shielding electrode 28 substantially cancels and the sensitivity of the sensing electrode 26 is, consequently, directed only in the direction away from the shielding electrode 28, i.e. into the detection space. When the driver grasps the steering wheel 18, capacitive coupling between the sensing electrode 26 and the vehicle chassis is increased compared to the situation, in which the driver has no hand on the steering wheel 18. As the steering wheel frame 24 is typically at the same potential as the vehicle chassis, strong capacitive coupling between the sensing electrode 26 and the steering wheel frame 24, in the absence of a driver's hand is undesirable. That is why the shielding electrode 28 comprises a margin that extends beyond the boundary of the sensing electrode 26. If the shielding electrode 28 were omitted, there would be a strong capacitive coupling between the sensing electrode 26 and the vehicle chassis even if the driver does not touch the steering wheel. The driver's hand(s) being put on the steering wheel would only slightly increase the capacitance. Absent a shielding electrode 28, the measurement circuitry would thus have to be able to detect a small signal on top of a large background, which is difficult (if not impossible) to achieve. Furthermore, the shielding electrode 28 represents a current path to chassis ground.

Figure 3:
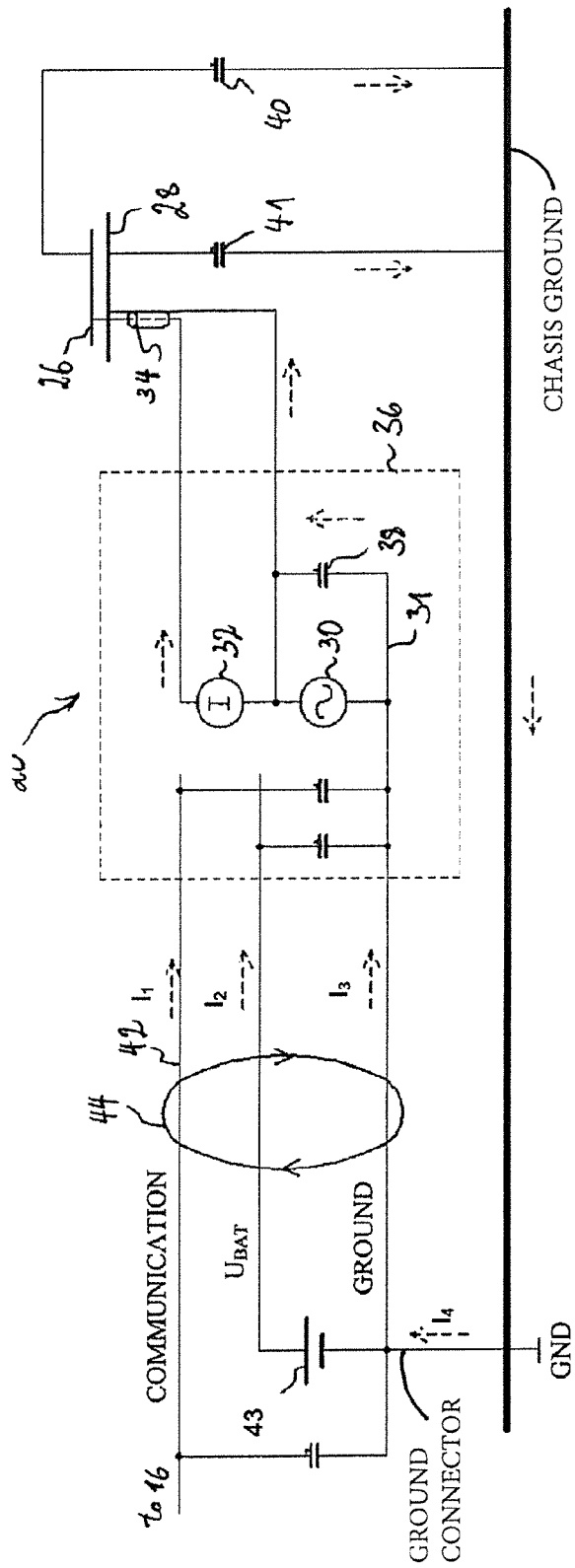
FIG. 3 is schematic circuit diagram of a capacitive detection device according to a preferred embodiment of the invention.

FIG. 3 is a simplified circuit diagram of the capacitive detection device 20 of FIG. 2. AC voltage source 30 is connected between node 31, which is at circuit ground potential, and the shielding electrode 28. In use, the AC voltage source 30 applies an oscillatory voltage at a measurement frequency in the range from 50 kHz to 500 kHz, e.g. at 100 kHz, to the shielding electrode 28. A current meter 32 connected between the sensing electrode 26 and the shielding electrode 28 is configured so as to copy the oscillatory voltage output by the AC voltage source 30 onto sensing electrode 26, whereby the sensing electrode 26 and the shielding electrode 28 are kept at the same AC potential. The current meter 32 is connected to the sensing electrode by the core of a shielded cable, whereas the shielding electrode is connected to the shielding electrode 28 by the shield of the shielded cable 34. The shielded cable extends substantially over the entire length of the connection line between the control circuit 36 in form of an application-specific integrated circuit. The current meter 32 is further configured to output a current measurement signal indicative of the complex current that the current meter has to drive into the sensing electrode in order to achieve the copying of the oscillatory voltage. That current measurement signal is indicative of capacitive coupling between the sensing electrode and (vehicle) chassis potential (illustrated by capacitance 40). A decision unit (not shown) of the control circuit 36 evaluates the measurement signal and derives whether the drives holds the steering wheel 18. The current meter 32 may e.g. comprise a synchronous rectifier to measure the real and imaginary part of the complex current. Capacitance 40 is determined from the impedance calculated as $U_{applied}/I_{meas}$, where $I_{meas}$ is the current measured by the current meter 32 and $U_{applied}$ is the AC voltage applied by the AC voltage source 30. Capacitance 41 indicates the capacitive coupling between the shielding electrode 28 and (vehicle) chassis ground.

A shunt capacitor 38 is connected between the node 31 and the shielding electrode. The shunt capacitor has a capacitance at least 25 times higher than the capacitance 41 between the shielding electrode 28 and chassis ground (which is tied to node 31 via a ground connector).

The capacitive detection device 20 is powered by the car battery, indicated at 43. The ground connector of the capacitive detection device 20 is tied to vehicle ground (chassis potential). A communication line 42 is provided for communication (e.g. via the vehicle's CAN bus) between the capacitive detection device 20 and the electronic control unit 16 of the ACC system with stop-and-go functionality.

For a capacitive detection device to work reliably, it has to measure very low capacitance changes and it has to handle electromagnetic interference (EMI). BCI (bulk current injection) is a method for simulating electromagnetic interference. To this end, a current clamp (schematically shown at 44) is arranged around all connection wires of the system cable. During the tests, the current clamp 44 is driven by a HF amplifier that injects disturbance currents at various frequencies (e.g. from 1 MHz to 400 MHz with current amplitudes up to 200 mA). This induces a plurality of common-mode interference currents $I_1$, $I_2$, $I_3$. Since the different wires are AC-coupled to circuit ground, the currents $I_1, I_2, I_3$ sum up to a current $I_4$, which enters the control circuit 36 of the capacitive detection device 20. It continues flowing from the capacitive detection device ground (node 31) to chassis ground via the capacitances 40 and 41. The series connection of the capacitor 38 and capacitance 41, between the shielding electrode 28 and (vehicle) chassis ground, thus provides a path with relatively low impedance to the common-mode interference currents and essentially prevents these to flow from circuit ground (node 31) into the measurement electronics.

A numerical example helps understanding the problem caused by the interference currents. Typically, the measurement voltage output by AC voltage source is 0.8 Veff @ 100 kHz. The capacitance 40 typically ranges down to 5 pF, which corresponds to an impedance of 320 kOhm at 100 kHz. (The upper bound of capacitance 40 is highly system-dependent but is typically comprised in the range from 150 pF to 250 pF.) With capacitance 40 amounting to 5 pF, absent interference currents, the current across capacitance 40 will amount to about 2.5 µA ($I_{meas}$=2.5 µA). The capacitance between the shielding electrode 28 and ground typically amounts to about 2 nF, which corresponds to an impedance of 800 Ohm at 100 kHz. The current across capacitance 41 then amounts to about 1 mA. Assuming an interference current $I_I$ of about 32 mA at a frequency of 2 MHz, it follows that $I_I/I_{meas}$=6400 (=76 dB). If a signal to noise ratio of 20 dB is required, the necessary attenuation of the interference current amounts to 96 dB.

The shunt capacitor 38 bypasses the measurement circuitry (the AC voltage source 30 and the current meter 32). In the numerical example, the capacitance of capacitor 38 may e.g. amount to 60 nF (corresponding to a 1.3 Ohm impedance @ 2 MHz). The shunt capacitor 38 and the shielding electrode's capacitance to ground 41 close the loop of the interference current without disturbing the current meter.

The AC voltage source 30 has to drive a current at the measurement frequency (e.g. 100 kHz) into the shunt capacitor 38. In an actual implementation, the maximum load drivable by the AC voltage source 30 thus implies an upper limit for the capacitance of the shunt capacitor 38.

While a specific embodiment have been described in detail, those skilled in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of the appended claims and any and all equivalents thereof.

The invention claimed is:

1. A capacitive detection device for a vehicle, comprising
  a sensing electrode for generating an oscillatory electric field in a detection space;
  a shielding electrode arranged on a side of said sensing electrode turned away from said detection space;
  a circuit ground and a ground connector, said ground connector connecting said circuit ground to a chassis ground of said vehicle; and
  at least one shunt capacitor connected between said circuit ground and said shielding electrode, said at least one shunt capacitor having a capacitance at least 25 times higher than a capacitance between said shielding electrode and chassis ground of said vehicle.

2. The capacitive detection device as claimed in claim 1, wherein said at least one shunt capacitor is a capacitor having a capacitance in the range from 20 to 100 nF.

3. The capacitive detection device as claimed in claim 1, wherein said at least one shunt capacitor comprises a first capacitor having a capacitance in the range from 20 to 100 nF and a second capacitor, in parallel to said first capacitor, having a capacitance in the range from 50 to 200 pF.

4. The capacitive detection device as claimed in claim 1, further comprising a vehicle battery, the capacitive detection device powered by said vehicle battery.

5. The capacitive detection device as claimed in claim 1, comprising
  an AC voltage source connected between said circuit ground and said shielding electrode, said AC voltage source configured to apply an oscillatory voltage at a measurement frequency comprised in the range from 50 kHz to 500 kHz to said shielding electrode; and a current meter connected between said sensing electrode and said shielding electrode, said current meter configured in such a way as to copy said oscillatory voltage in terms of amplitude and phase into said sensing electrode and to output a current measurement signal indicative of a complex current across said current meter necessary for achieving the copying of said oscillatory voltage; said current measurement signal being indicative of capacitive coupling between said sensing electrode and a reference potential.

6. The capacitive detection device as claimed in claim 5, comprising a shielded cable having a core and a shield, wherein said core connects said sensing electrode to said current meter and wherein said shield connects said shielding electrode to said AC voltage source.

7. The capacitive detection device as claimed in claim 5, comprising a shielded cable having a core and a shield, wherein said core connects said sensing electrode to said current meter and wherein said shield connects said shielding electrode to said AC voltage source, wherein said at least one shunt capacitor is a capacitor having a capacitance in the range from 20 to 100 nF.

8. The capacitive detection device as claimed in claim 5, comprising a shielded cable having a core and a shield, wherein said core connects said sensing electrode to said current meter and wherein said shield connects said shielding electrode to said AC voltage source, wherein said at least one shunt capacitor comprises a first capacitor having a capacitance in the range from 20 to 100 nF and a second capacitor, in parallel to said first capacitor, having a capacitance in the range from 50 to 200 nF.

9. A Hands-on and/or hands-off detector for a steering wheel, comprising a capacitive detection device as claimed in claim 1.

10. A steering wheel, comprising the hands-on and/or hands-off detector as claimed in claim 9.

11. An active cruise control system, comprising the hands-on and/or hands-off detector as claimed in claim 9.

12. An occupant detector for a car seat, comprising a capacitive detection device as claimed in claim 1.

13. A car seat comprising an occupant detector as claimed in claim 12.

\* \* \* \* \*